United States Patent
Wang et al.

(10) Patent No.: US 7,312,506 B2
(45) Date of Patent: Dec. 25, 2007

(54) MEMORY CELL STRUCTURE

(75) Inventors: Yu-Jen Wang, Taipei (TW); Chih-Huang Lai, Hsinchu (TW); Denny Tang, Hsinchu (TW); Wen Chin Lin, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 493 days.

(21) Appl. No.: 11/093,652

(22) Filed: Mar. 30, 2005

(65) Prior Publication Data

US 2006/0233002 A1    Oct. 19, 2006

(51) Int. Cl.
*H01L 29/82* (2006.01)

(52) U.S. Cl. ............... 257/427; 257/422; 257/E43.004; 257/E27.006

(58) Field of Classification Search ................ 257/421, 257/422, 427, E43.004, E27.006; 365/66, 365/158, 173
See application file for complete search history.

(56) References Cited

U.S. PATENT DOCUMENTS

| | | | |
|---|---|---|---|
| 5,966,012 A * | 10/1999 | Parkin | 324/252 |
| 6,639,291 B1 * | 10/2003 | Sin et al. | 257/427 |
| 2004/0141367 A1 * | 7/2004 | Amano et al. | 365/158 |

* cited by examiner

*Primary Examiner*—Matthew E. Warren
(74) *Attorney, Agent, or Firm*—Thomas, Kayden, Horstemeyer & Risley

(57) ABSTRACT

A memory cell structure. A first conductive line is cladded by at least two first ferromagnetic layers respectively having a first easy axis and a second easy axis, a nano oxide layer located between the first ferromagnetic layers, and a first pinned ferromagnetic layer. The first and second easy axes are 90 degree twisted-coupled with the first easy axis parallel to the length of the first conductive line and the second easy axis perpendicular to the length of the first conductive line. A storage device is adjacent to the first conductive line, receiving a magnetic field generated from a current flowing through the first conductive line.

20 Claims, 10 Drawing Sheets

MEMORY CELL STRUCTURE

BACKGROUND

The disclosure relates in general to Magnetoresistive Random Access Memories (MRAMs), and more particularly to magnetic tunnel junction (MTJ) MRAM arrays and a specific architecture for connecting the arrays.

Magnetic random access memory (MRAM) cells are often based on a magnetic tunnel junction (MTJ) cell. Basically, an MTJ configuration can be made up of three basic layers, a "free" ferromagnetic layer, an insulating tunneling barrier, and a "pinned" ferromagnetic layer. In the free layer, the magnetization moments are free to rotate under an external magnetic field, but the magnetic moments in the "pinned" layer cannot. The pinned layer can be composed of a ferromagnetic layer and/or an anti-ferromagnetic layer which "pins" the magnetic moments in the ferromagnetic layer. A very thin insulation layer forms the tunneling barrier between the pinned and free magnetic layers. In order to sense states in the MTJ configuration, a constant current can be applied through the cell. As the magneto-resistance varies according to the state stored in the cell, the voltage can be sensed over the memory cell. To write or change the state in the memory cell, an external magnetic field can be applied that is sufficient to completely switch the direction of the magnetic moments of the free magnetic layers.

MTJ configurations often employ the Tunneling Magneto-Resistance (TMR) effect, which allows magnetic moments to quickly switch the directions in the magnetic layer by an application of an external magnetic field. Magneto-resistance (MR) is a measure of the ease with which electrons may flow through the free layer, tunneling barrier, and the pinned layer. A minimum MR occurs in an MTJ configuration when the magnetic moments in both magnetic layers have the same direction or are "parallel". A maximum MR occurs when the magnetic moments of both magnetic layers are in opposite directions or are "anti-parallel."

FIG. 1A is a schematic perspective view illustrating a conventional MTJ cell of an MRAM device. FIG. 1B is a schematic perspective view illustrative of read out operation of the MTJ cell of FIG. 1A. FIG. 1C is a plane view illustrative of respective magnetization states depending on stored data of the MTJ cell of FIG. 1A.

The single memory cell comprises: a first metal layer 11; a pinned layer 12; a tunnel barrier layer 13; a free layer 14; and a second metal layer 12. The MTJ cell comprises: the pinned layer 12; the dielectric layer 13; and the free layer 14. The tunnel barrier layer 13 is sandwiched between the pinned layer 12 and the free layer 14. The pinned layer 12 is in contact with the first metal layer 11. The free layer 14 is in contact with the second metal layer 12. The pinned layer 12 and the free layer 14 are made of ferromagnetic materials. The dielectric layer 13 is made of an insulating material. The pinned layer 12 has a fixed magnetization direction. The dielectric layer 13 has a thickness of about 1.5 nanometers. The free layer 14 has a thickness of about 20 nanometers. The free layer 14 has a freely changeable magnetization direction.

The magnetization direction of the free layer 14 indicates stored data. The free layer 14 serves as a data storage layer. The first metal layer 11 and the second metal layer 15 extend in directions perpendicular to each other. The MTJ cell is positioned at a crossing point between the first metal layer 11 and the second metal layer 15. In FIG. 1B, a current 16 flows from the first metal layer 11 to the second metal layer 15 through the pinned layer 12, the dielectric layer 13, and the free layer 14. The MTJ cell is capable of storing binary digit data "0" and "1". If the magnetization directions of the pinned layer 12 and the free layer 14 are parallel to each other, then this means that the MTJ cell stores a first binary digit, for example, "0". If the magnetization directions of the pinned layer 12 and the free layer 14 are not parallel, then this means that the MTJ cell stores a second binary digit, for example, "1". The magnetization direction of the free layer 14 changes depending on an externally applied magnetic field.

An electrical resistance of the dielectric layer 13 varies by about 10-60% due to the tunneling magnetoresistance effect between in a first state where the magnetization directions of the pinned layer 12 and the free layer 14 are parallel to each other and a second state where the magnetization directions of the pinned layer 12 and the free layer 14 are not parallel. A predetermined potential difference or a predetermined voltage is applied to the first and second metal layers 11 and 15 to apply a tunneling current from the pinned layer 12 to the free layer 14 through the dielectric layer 13. This tunneling current varies depending on the variable electrical resistance of the dielectric layer 13 due to the tunneling magnetoresistance effect. The data can be fetched from the MTJ cell by detecting the variation in the tunneling current.

FIG. 2A is a fragmentary schematic perspective view illustrative of an array of MTJ cells of the MRAM of FIG. 1A. FIG. 2B is a fragmentary schematic perspective view illustrative of the array of the MTJ cells during the operation shown in FIG. 2A.

The first metal layers 11 extend in parallel to each other in a first direction. The second metal layers 15 extend in parallel to each other in a second direction, which is perpendicular to the first direction. The single first metal layer 11 and the single second metal layer 15 have a single crossing point, where a single MTJ cell "C" is provided. The plural first metal layers 11 and the plural second metal layers 15 have an array of crossing points where plural MTJ cells "C" are provided. The first metal layers 11 serve as word lines. The second metal layers 15 serve as bit lines. One of the plural MTJ cells "C" is selected by selecting one of the word lines and one of the bit lines, for read or write operations to the selected MTJ cell "C".

The MRAM has the array of the MTJ cells, each of which comprises the tunneling magnetoresistance element utilizing the tunneling magnetoresistance effect, wherein the tunneling magnetoresistance element includes an insulating thin film sandwiched between the two or more ferromagnetic thin films. The tunneling magnetoresistance element is switched between a first state, in which the magnetization directions of the two ferromagnetic thin films are parallel to each other, and a second state, in which the magnetization directions of the two ferromagnetic thin films are anti-parallel. The resistance of the insulating film, which the tunneling current senses, is different for the first and second states. These two states correspond to binary digits, for example, the first state corresponds to the data "0", and the second state corresponds to the data "1".

The write operation is accomplished as follows. One of the word lines 11 and one of the bit lines 15 are selected. A first write current Isw is applied to the selected word line 11s. A first magnetic field Msw is generated around the selected word line 11s. The first write current Isw has a predetermined current value and a predetermined direction. A second write current Isb is applied to the selected bit line 15s. The second write current Isb has a predetermined current value and a predetermined direction. A second magnetic field Msb is generated around the selected bit line 15s. As a result, a superimposed magnetic field of both the first and second magnetic field Msw and Msb is applied to the crossing point of the selected word line 11s and the selected bit line 15s. The selected MTJ cell "Cs" is positioned at the crossing point of the selected word line 11s and the selected bit line 15s, for which reason the selected MTJ cell "Cs" is applied with the superimposed magnetic field. The free layer of the selected MTJ cell "Cs" is also applied with the superimposed magnetic field, whereby magnetic domains of the free layer become ordered in a first direction, for example, in a direction parallel to the magnetization direction of the pinned layer. As a result, the selected MTJ cell "Cs" stores a binary digit data "0".

Any first write current Isw or second write current Isb changes its current direction to an opposite direction, whereby the direction of the magnetic field is inverted, and the direction of the superimposed magnetic field is changed by approximately 90 degrees. As a result, the magnetic domains of the free layer become ordered in a second direction, for example, in a direction anti-parallel to the magnetization direction of the pinned layer. As a result, the selected MTJ cell "Cs" stores another binary digit "1".

The read operation is accomplished as follows. One of the word lines 11 and one of the bit lines 15 are selected. A potential difference is applied between the selected word line 11s and the selected bit line 15s for measuring a current value to detect a resistance value of the selected memory cell "Cs" to the tunneling current. Namely, a predetermined potential difference or a predetermined voltage is applied to the selected word line 11s and the selected bit line 15s to provide a tunneling current from the pinned layer through the insulating layer to the free layer of the selected memory cell "Cs". This tunneling current varies depending on the variable electrical resistance of the insulating layer due to the tunneling magnetoresistance effect. The binary digit data can be detected from the selected memory cell "Cs" by detecting the variation in the tunneling current.

FIG. 3 is a diagram illustrative of a conventional array structure of the MTJ cells in the MRAM. An array 21 includes 2m word lines (W1, W2, W3, - - - Wm, Wm+1, - - -, W2m) and 2n bit lines (B1, B2, B3, - - - Bn, Bn+1, - - -, B2n) as well as 2 m×2n MTJ cells (C11, C12, - - -, C2m2n) that are positioned at crossing points of the word and bit lines. A word line Wig and a bit line Bj are selected to select a MTJ cell Cij positioned at the crossing point between the selected word line Wi and the selected bit line Bj for read or write operation as described above.

As mentioned above, the first and second write current are provided to generate the first and second magnetic fields around the selected conductive lines, respectively. For reducing the current density, a ferromagnetic layer adjacent to the conductive line would dramatically enhance the magnetic field generated by the conductive line. For linear response in the magnetic field by the conductive lines, the hard axis of the ferromagnetic layer is parallel to the magnetic field. Due to the enhancement in magnetic field by the ferromagnetic layer, less power will be consumed during a writing process. In FIG. 4, for linear response and zero remnant magnetization of the ferromagnetic layer, the easy axis EA of the ferromagnetic layer 32 would be set parallel to the current direction Id along the conductive line 31. Here, the easy axis EA of the ferromagnetic layer 32 is pinned by the anti-ferromagnetic layer 33 and substantially perpendicular to the circular magnetic field Hd generated by the current Id. Therefore, the ferromagnetic layer 32 inserted adjacent to the conductive line 31 will force the magnetization of the ferromagnetic layer 32 parallel to the current direction. Here, the ferromagnetic layer 32 and the anti-ferromagnetic layer 33 comprise a ferromagnetic cladding layer.

U.S. Patent Application 20020182557 discloses a method to heat-treat (or annealing process) a substrate provided with thin magnetic layers in a magnetic field to magnetize the pinned layer in one direction. Typically, an oriented magnetic field of 0.5 T (tesla) or more must typically be applied, and an oriented magnetic field of more than 1.0 T is often necessary depending on the materials of the pinned layer. To apply an oriented magnetic field to wafer substrates, a vacuum heat-treating furnace has conventionally been used. This vacuum heat-treating furnace comprises a magnetic field-generating coil equipped with a cooling pipe, a high-frequency coil disposed inside the coil, and a vacuum container for holding a plurality of wafer substrates disposed inside the high-frequency coil.

However, due to the substantially orthogonal write line structure, the ferromagnetic cladding layers, which respectively clad the word line and the bit line, are substantially perpendicular to each other. Here, the easy axes of the substantially perpendicular word line and bit line are also substantially perpendicular. Thus, the ferromagnetic cladding layers have to be exchange-biased with anti-ferromagnets exhibiting different anneal temperatures to form the ferromagnetic cladding layers of the bit line and the word line with perpendicular easy axes.

In addition, a complicated annealing process with at least two annealing steps in mutually perpendicular annealing processing-fields is typically necessary. The obvious disadvantage is that one ferromagnetic cladding layer in which anisotropy is set in the first annealing process is affected by the following second annealing process.

SUMMARY

One object of the present invention is thus to provide a MRAM cell having ferromagnetic cladding layers respectively cladding the word line and the bit line perpendicular to each other. In addition, the easy axes of the perpendicular word line and bit line are set perpendicularly by single annealing process step.

To achieve the above-mentioned object, embodiments of the present invention provide a memory cell structure. A first conductive line is cladded by at least two first ferromagnetic layers respectively having a first easy axis and a second easy axis, a nano oxide layer located between the first ferromagnetic layers, and a first pinned ferromagnetic layer. The first and second easy axes are 90 degree twisted-coupled with the first easy axis parallel to the length of the first conductive line and the second easy axis perpendicular to the length of the first conductive line. A storage device is adjacent to the first conductive line, receiving a magnetic field generated from a current flowing through the first conductive line.

In addition, embodiments of the present invention provide a memory cell structure. A first conductive line is cladded by a plurality of films, including a first ferromagnetic layer having a first easy axis and cladding the first conductive line. The first easy axis is parallel to the length of the first conductive line. The first ferromagnetic layer is cladded by a nano oxide layer. A synthetic anti-ferromagnetic layer cladding the nano oxide layer, includes a second ferromagnetic layer having a second easy axis perpendicular to the first easy axis, a third ferromagnetic layer having a third easy axis anti-parallel to the second easy axis, and a dielectric layer located between the second ferromagnetic layer and the third ferromagnetic layer. The synthetic anti-ferromagnetic layer is cladded by a first pinned ferromagnetic layer. A storage device is adjacent to the first conductive line, receiving a magnetic field generated from a current flowing through the first conductive line.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION

Figure 1A:
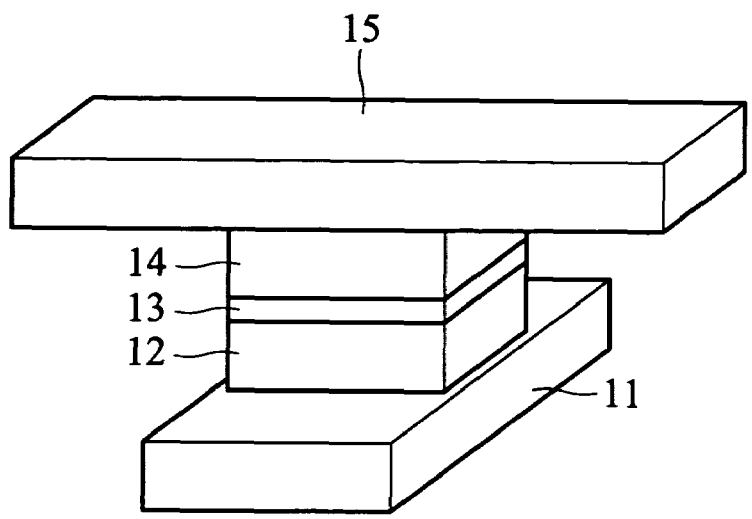
FIG. 1A is a schematic perspective view illustrative of a conventional MTJ cell of the MRAM device.
Figure 1B:
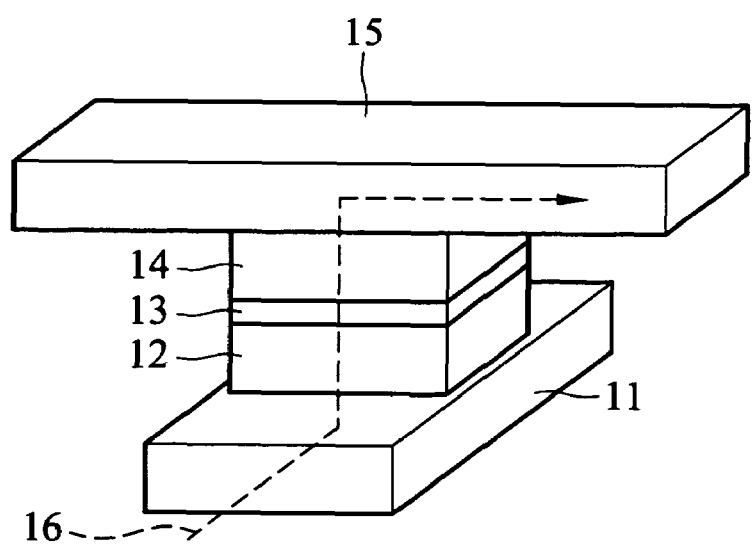
FIG. 1B is a schematic perspective view illustrative of a read out operation of the MTJ cell of FIG. 1A.
Figure 1C:
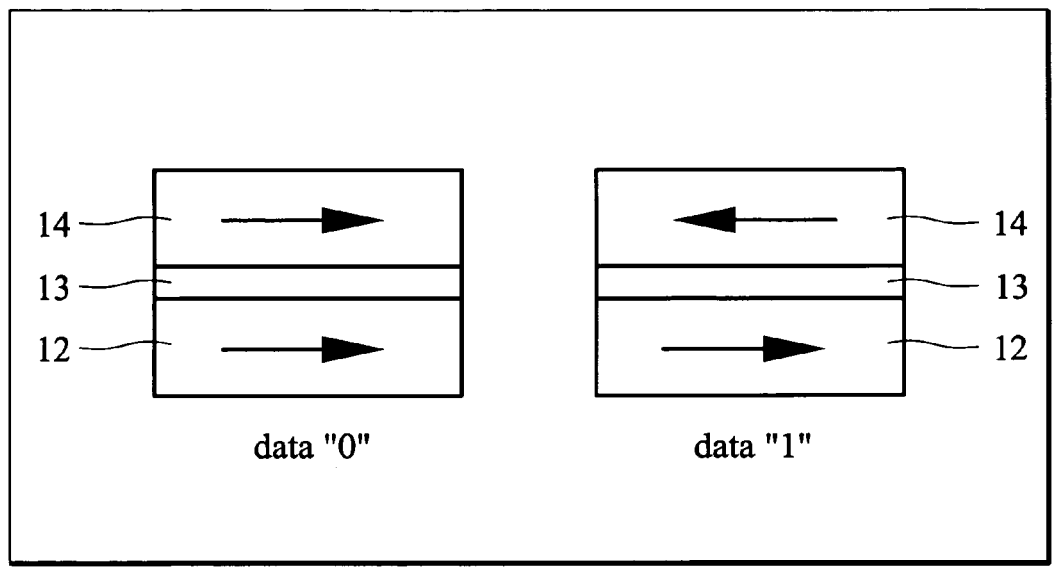
FIG. 1C is a plan view illustrative of respective magnetization states depending on stored data of the MTJ cell of FIG. 1A.
Figure 2A:
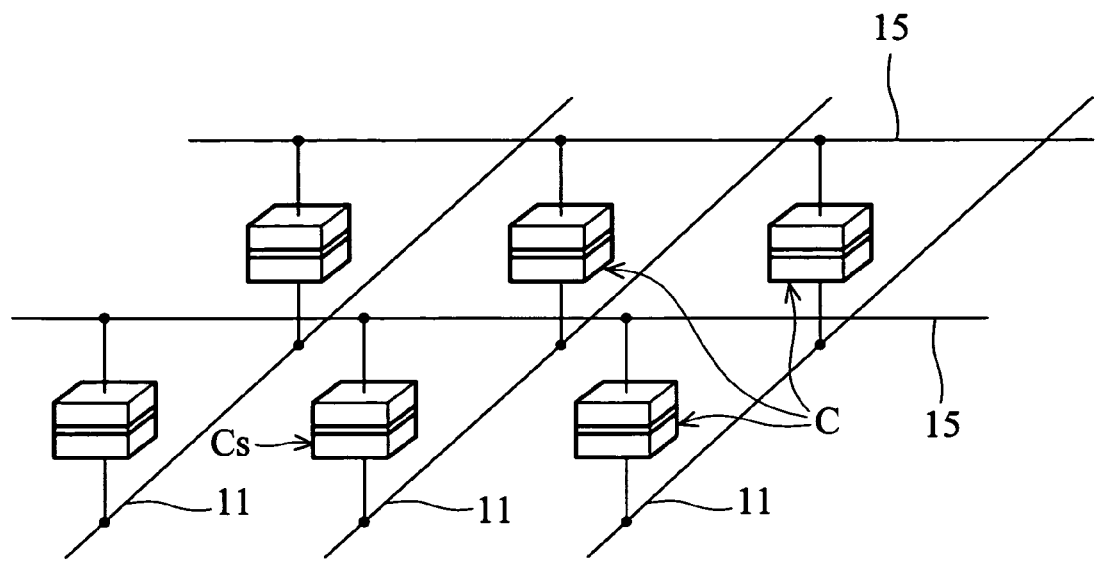
FIG. 2A is a fragmentary schematic perspective view illustrative of an array of MTJ cells of the MRAM of FIG. 1A.
Figure 2B:
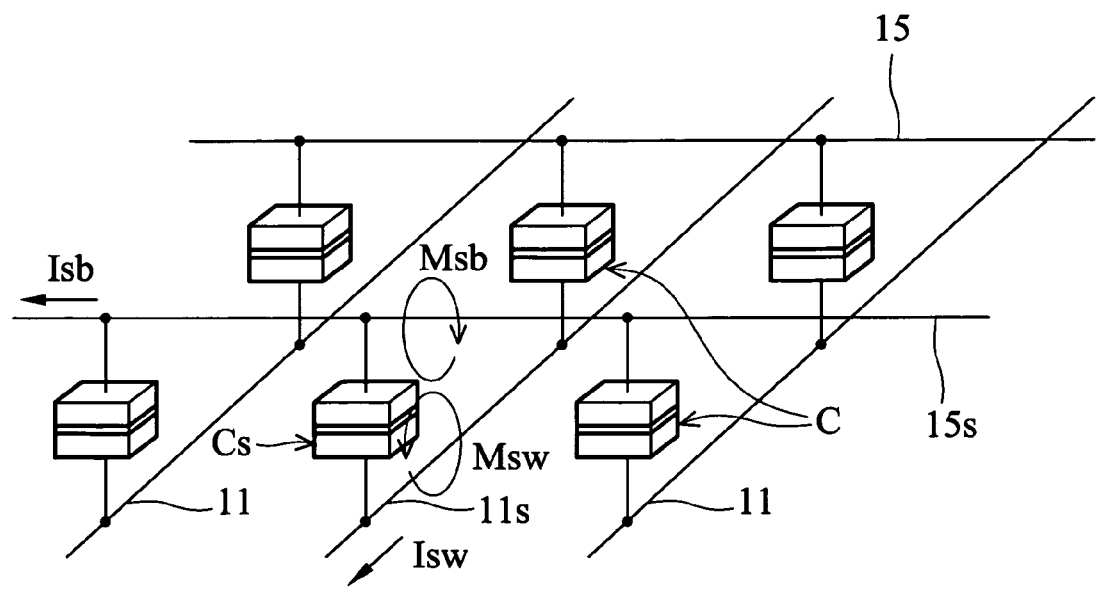
FIG. 2B is a fragmentary schematic perspective view illustrative of the array of the MTJ cells during a write operation shown in FIG. 2A.
Figure 3:
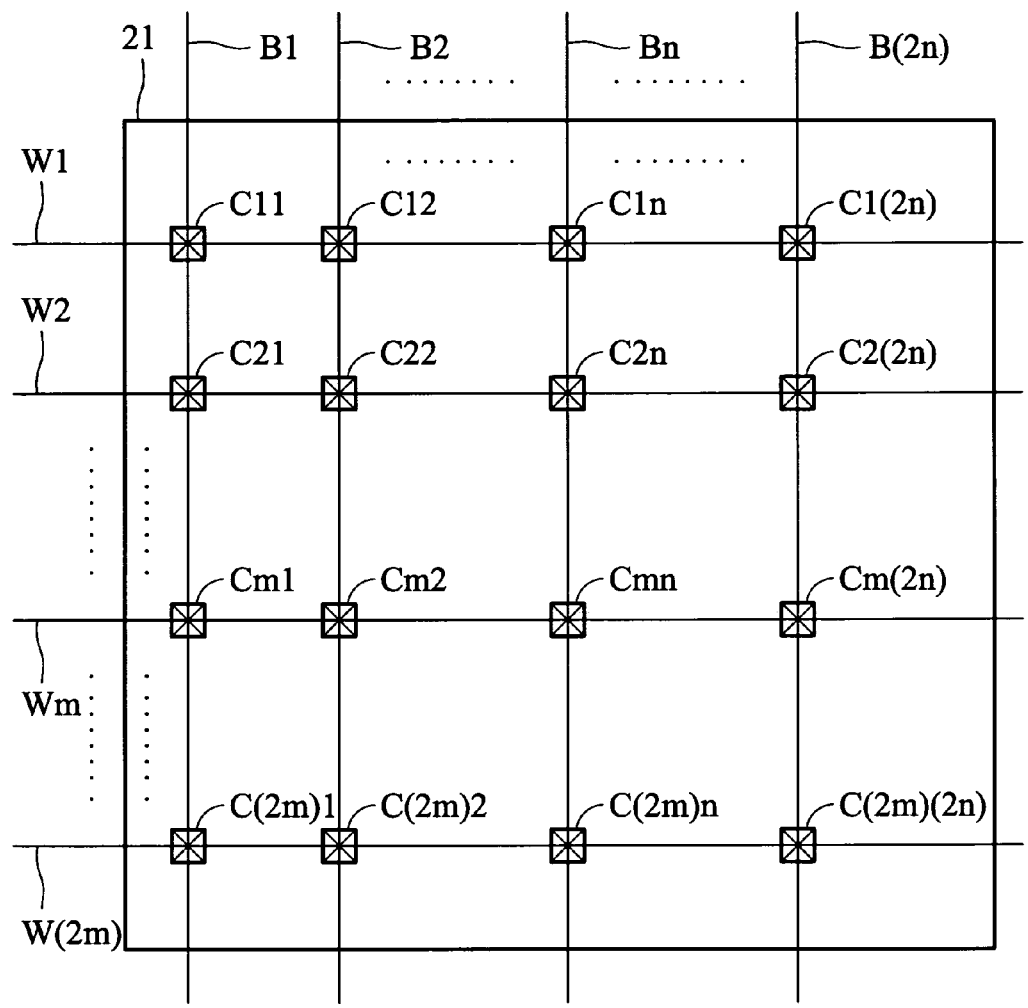
FIG. 3 is a diagram illustrative of a conventional array structure of the MTJ cells in the MRAM.
Figure 4:
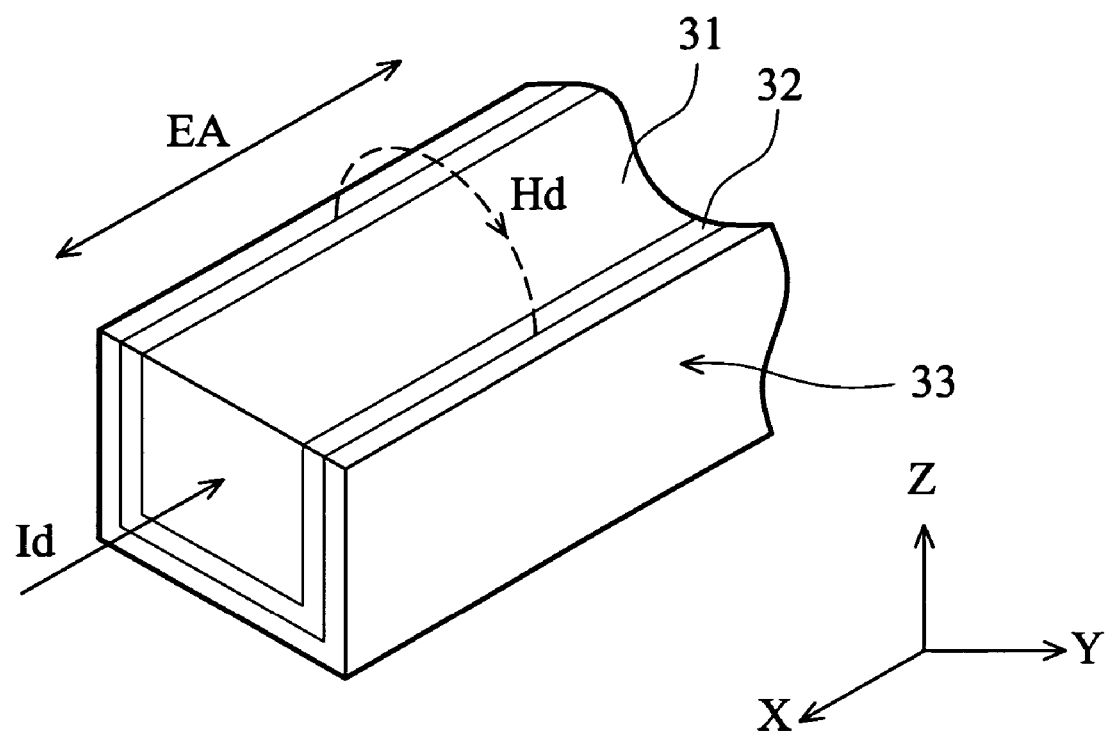
FIG. 4 is a schematic perspective view illustrative of the program line of the MTJ cell.
Figure 5:
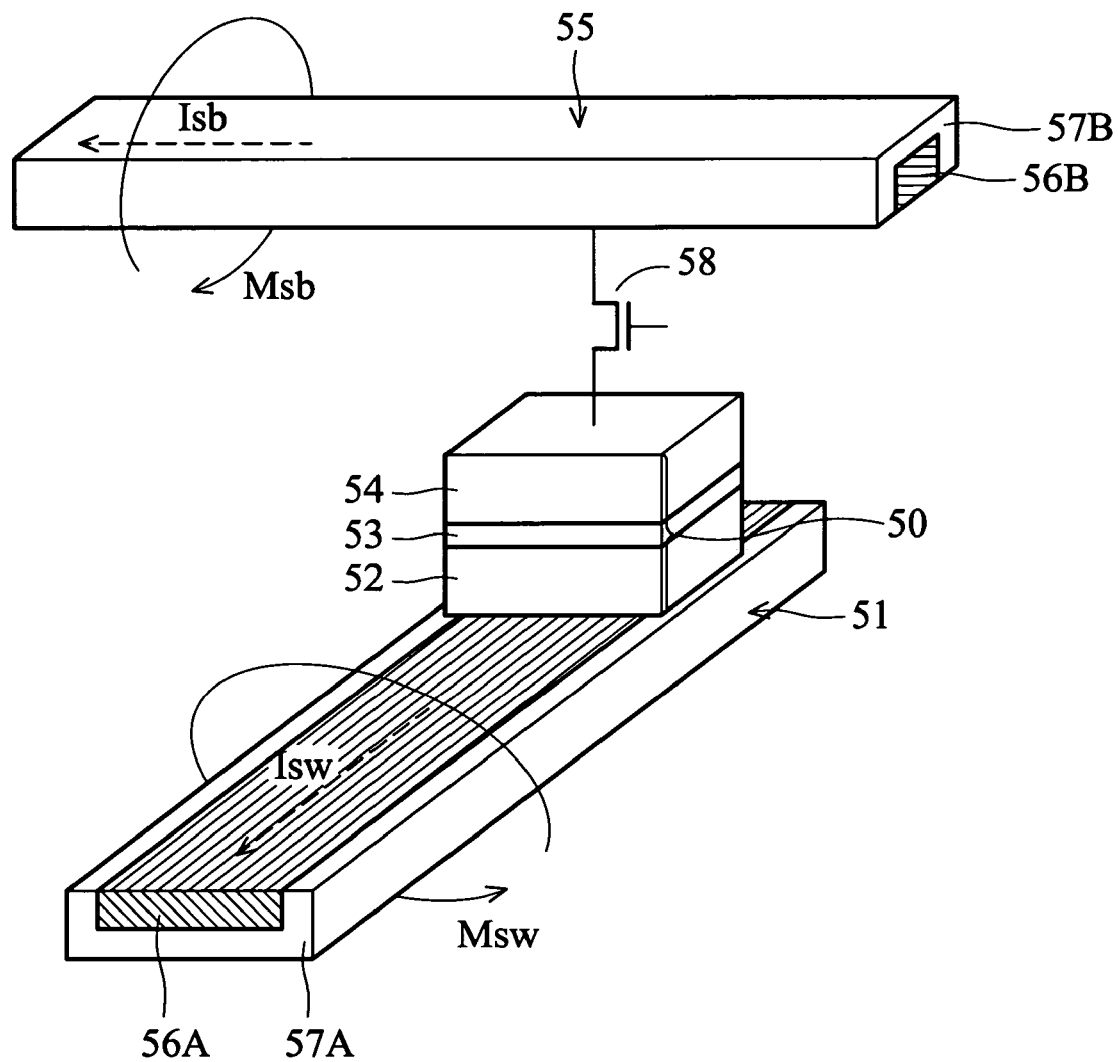
FIG. 5 is a schematic perspective view illustrative of one memory cell of the MRAM device.

FIG. 5 is a schematic perspective view illustrative of one memory cell of the MRAM device. The memory cell comprises a first metal layer 51, an MTJ cell 50, and a second metal layer 55. The MTJ cell 50 comprises the pinned layer 52, the dielectric layer 53, and the free layer 54. The tunnel barrier layer 53 is sandwiched between the pinned layer 52 and the free layer 54. The pinned layer 52 is in contact with the first metal layer 51. Here, the first metal layer 51 can be coupled or isolated with the MTJ cell 50 in different implementations.

The free layer 54 is in coupled to the second metal layer 55 through a switch 58. The pinned layer 52 and the free layer 54 are made of ferromagnetic materials. The tunnel barrier layer 53 is made of an insulating material. The pinned layer 52 has a fixed magnetization direction. The dielectric layer 53 has a thickness of about 1.5 nanometers. The free layer 54 has a thickness of about 20 nanometers. The free layer 54 has a freely changeable magnetization direction.

The magnetization direction of the free layer 54 indicates stored data. The free layer 54 serves as a data storage layer. The first metal layer 51 and the second metal layer 55 extend in directions substantially perpendicular to each other. The MTJ cell 50 is positioned at a crossing point between the first metal layer 51 and the second metal layer 55. The MTJ cell 50 is capable of storing binary digit data "0" and "1". If the magnetization directions of the pinned layer 52 and the free layer 54 are parallel to each other, then this means that the MTJ cell 50 stores a first binary digit, for example, data "0". If the magnetization directions of the pinned layer 52 and the free layer 54 are not parallel, then this means that the MTJ cell 50 stores a second binary digit, for example, "1". The magnetization direction of the free layer 54 is changed depending on an externally applied magnetic field.

An electrical resistance of the dielectric layer 53 varies by about 10-60% due to the tunneling magnetoresistance effect between a first state, where the magnetization directions of the pinned layer 52 and the free layer 54 are parallel to each other, and a second state, where the magnetization directions of the pinned layer 52 and the free layer 54 are anti-parallel. A predetermined potential difference or a predetermined voltage is applied to the first and second metal layers 51 and 55 to provide a tunneling current from the pinned layer 52 to the free layer 54 through the dielectric layer 53. This tunneling current varies depending on the variable electrical resistance of the dielectric layer 53 due to the tunneling magnetoresistance effect. The data can be fetched from the MTJ cell 50 by detecting the variation in the tunneling current.

During a write operation, the first metal line (word line) 51 and the second metal line (bit line) 55 are selected. A first write current Isw is applied to the selected word line 51. A first magnetic field Msw is generated around the selected word line 51. The first write current Isw has a predetermined current value and a predetermined direction. A second write current Isb is applied to the selected bit line 55. The second write current Isb has a predetermined current value and a predetermined direction. A second magnetic field Msb is generated around the selected bit line 55. As a result, a superimposed magnetic field of both the first and second magnetic fields Msw and Msb is applied to the crossing point of the selected word line 51 and the selected bit line 55. The selected MTJ cell 50 is positioned at the crossing point of the selected word line 51 and the selected bit line 55, for which reason the superimposed magnetic field is applied to the selected MTJ cell 50. The free layer of the selected MTJ cell 50 is also applied with the superimposed magnetic field, whereby magnetic domains of the free layer become ordered in a first direction, for example, in a direction parallel to the magnetization direction of the pinned layer. As a result, the selected MTJ cell 50 stores a binary digit data "0".

To enhance the magnetic fields generated by the selected word line and bit line, metal lines 56A and 56B of the word line and the bit line are respectively clad by ferromagnetic cladding layers 57A and 57B. Thus, the metal line 56A and the cladding layer 57A comprise a first program line. In addition, the metal line 56B and the cladding layer 57B comprise a second program line.

As mentioned above, the ferromagnetic layer (cladding layer) adjacent to the metal line dramatically enhances the magnetic field generated by the metal line. For linear response in the magnetic field by the conductive lines, the easy axis of the ferromagnetic layer must typically be substantially perpendicular to the magnetic field. Thus, less power will be consumed during a writing process by setting the easy axis of the ferromagnetic cladding layers substantially parallel to the current direction of the selected word line and bit line, respectively.

Figure 6A:
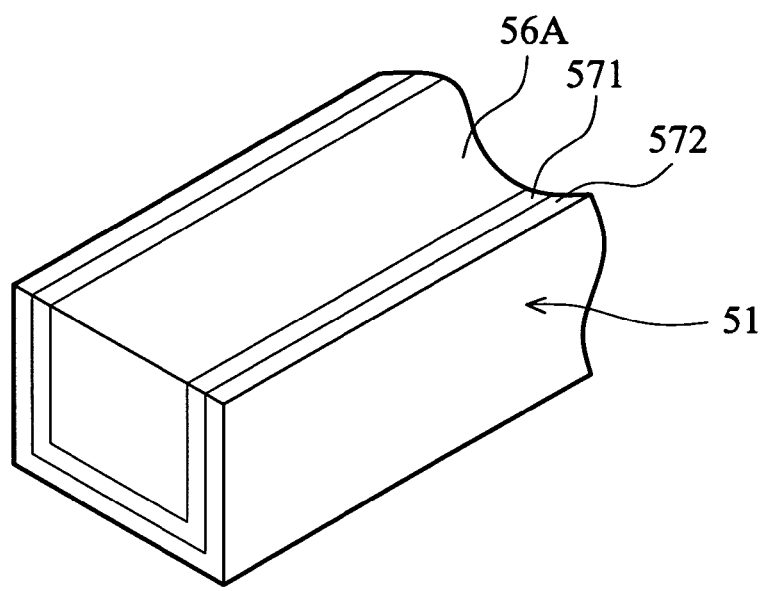
FIG. 6A and FIG. 6B are schematic perspective views illustrative of the word line and the bit line, respectively.
Figure 6B:
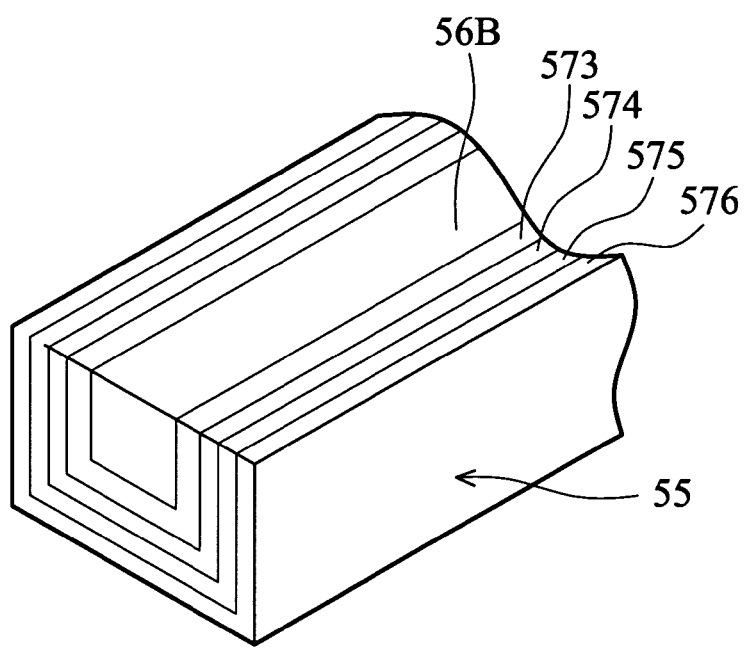

FIGS. 6A and 6B are schematic perspective views illustrative of the word line and the bit line, respectively. The structures of the word line and the bit line may also be respectively illustrated in the FIGS. 6A and 6B.

In FIG. 6A, the word line comprises, sequentially, a metal line 56A, a ferromagnetic layer 571, and an anti-ferromagnetic layer 572, which is a pinned ferromagnetic layer for sustaining the magnetization of the ferromagnetic layer 571. In FIG. 6B, the bit line comprises, sequentially, a metal line 56B, a ferromagnetic layer 573, a nano oxide layer (known as NOL) 574, a ferromagnetic layer 575, and an anti-ferromagnetic layer 576, which is a pinned ferromagnetic layer for sustaining the magnetization of the ferromagnetic layer 575. Here, the oxide spacer 574 is comprised of magnetic oxide material such as FeOx. Some embodiments of the metal lines 56A and 56B can be made of alloy, copper, tantalum, titanium, cobalt, or ferruginous.

Figure 7:
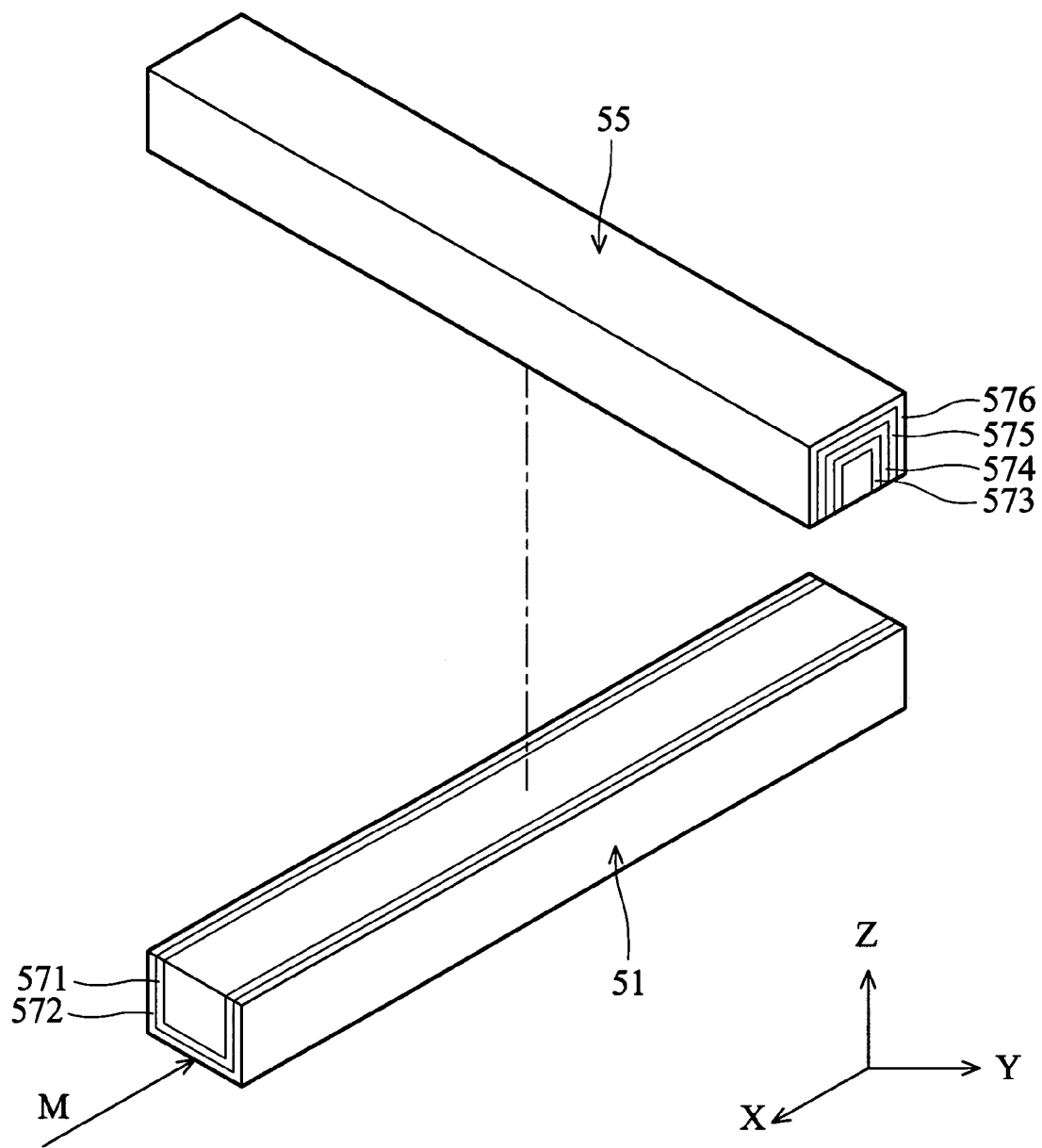
FIG. 7 is a schematic perspective view illustrative of the annealing process.
Figure 8A:
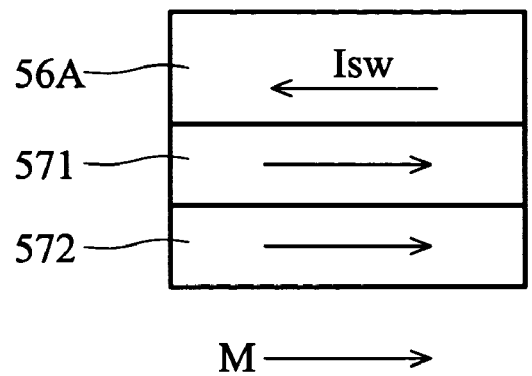
FIG. 8A and FIG. 8B are plan views illustrative of magnetization states of two program lines, respectively.
Figure 8B:
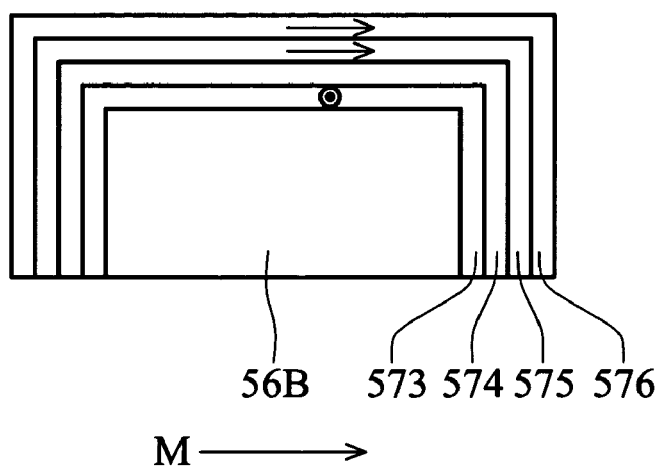
Figure 9:
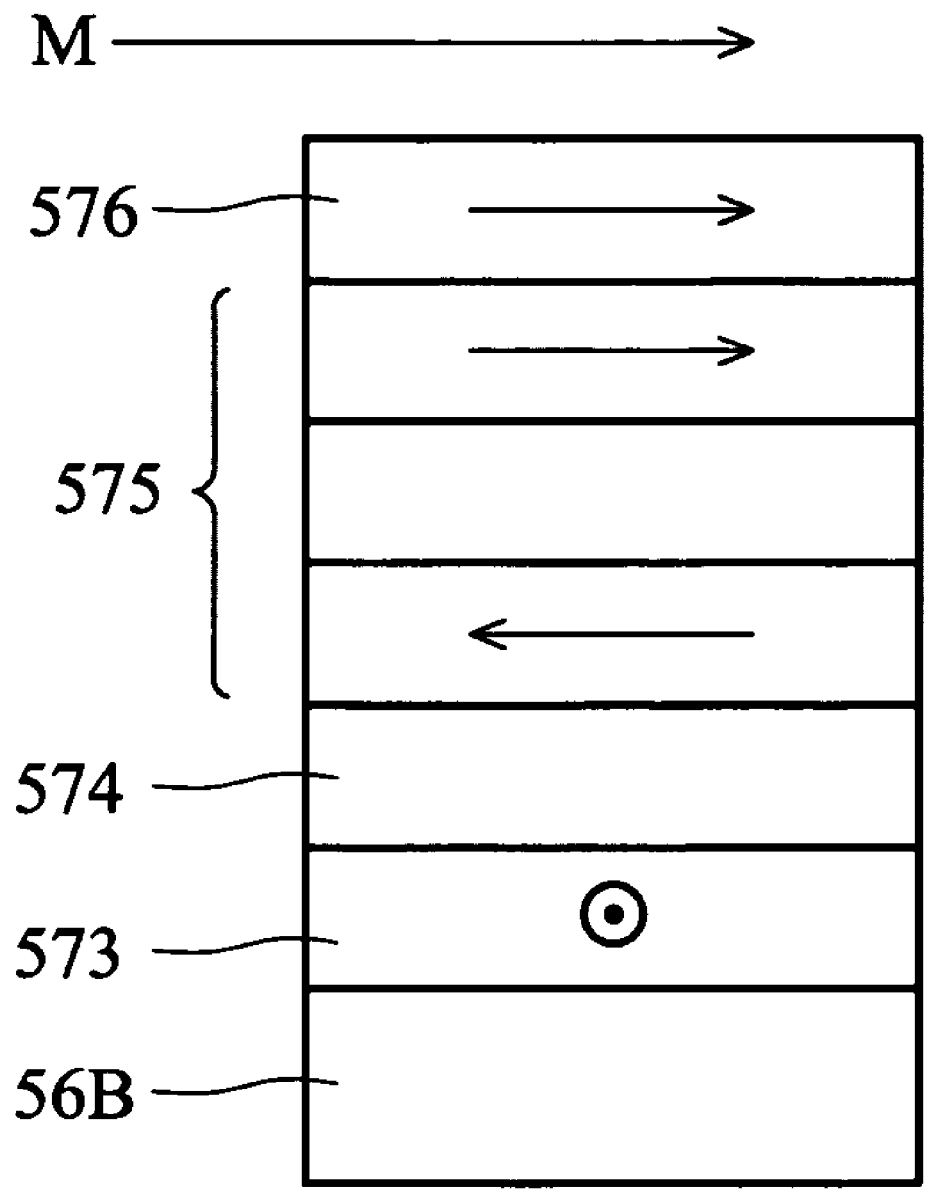
FIG. 9 is a plan view illustrative of magnetization states of the alternative structure of the program line using synthetic anti-ferromagnetic layer.

To develop the magnetization of the magnetic cladding layers of the word line and the bit line, only one annealing process step is performed in some embodiments of the present invention. FIG. 7 is a schematic perspective view illustrative of one embodiment of the annealing process. Here, the word line 51 is set along the X axis and the bit line 55 is set along the Y axis. An annealing field M pointed along the positive X direction is applied during the annealing process. Due to the exchange anisotropy pinning, the magnetization direction of the ferromagnetic layers 571, 573 and 575 will point to the direction of the annealing process field (X axis) M. In other words, the Y direction is the hard axis of the ferromagnetic layers 571, 573 and 575. Thus, the magnetization direction of the ferromagnetic layer 571 is pinned by the anti-ferromagnetic layer 572, and the magnetization direction of the ferromagnetic layer 575 is pinned by the anti-ferromagnetic layer 576, as shown in FIGS. 8A and 8B. In FIG. 8A, the arrows represent the magnetization direction of the ferromagnetic layer 571 and the anti-ferromagnetic layer 572. In FIG. 8B, the arrows represent the magnetization direction of the ferromagnetic layer 575 and the anti-ferromagnetic layer 576. After the annealing process field is removed, the magnetization directions of the ferromagnetic layers 571 and 575 are still pinned by the anti-ferromagnetic layer 572 and 576 with exchange anisotropy and are aligned along the annealing process field M. However, the magnetization direction of the ferromagnetic layer 573 is perpendicular to the ferromagnetic layer 575 by spin flop through the oxide spacer, as shown in FIG. 8B. In addition, the magnetization direction of the ferromagnetic layer 573 is along the Y axis. Furthermore, the alternative layer structure of the ferromagnetic layer 575 uses a synthetic anti-ferromagnetic layer (SAF) shown in FIG. 9. In the SAF structure, the ferromagnetic layer 575 is divided into a ferromagnetic layer 575A, an oxide layer 575C, and a ferromagnetic layer 575B. Thus, the ferromagnetic layers 575A and 575B are anti-ferromagnetically coupled through an ultra thin oxide layer (Ru) owning to Ruderman-Kittel-Kasuya-Yoshida(RKKY) coupling. Due to the magnetization of the ferromagnetic layers 575A and 575B being equal but in opposite directions, the self-closed flux loops between the terminals of the ferromagnetic layers 575A and 575B at both side are respectively created, eliminating the effect of the magnetization on the free layer of the memory cell due to the magnetic flux between both terminals of the ferromagnetic layer 575 in FIG. 8B.

Thus, the magnetic cladding layers of the word line and the bit line according to the present invention set the ferromagnetic layers perpendicular to each other with only one annealing processing step by adding an oxide spacer (oxide layer). The magnetization direction of each layer in the multilayer ferromagnetic cladding layer is along the word line 51 and the bit line. As mentioned above, in FIG. 7, the magnetization direction of the ferromagnetic layers 571 is pinned by the anti-ferromagnetic layers 572 along the annealing process field direction M. With a spin flip mechanism, the magnetic direction of the ferromagnetic layers 573 is orthogonal to the magnetization direction of the ferromagnetic layer 571 after a single annealing process. Therefore, the easy axis of the ferromagnetic cladding layer of bit line and the word line are substantially perpendicular to each other after only one annealing process. Since there is only one annealing processing step to be carried out, the mutual affection in ferromagnetic cladding layers of the bit line and the word line from two annealing process steps by the conventional method is avoided.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory cell structure, comprising:
   a first conductive line cladded by a plurality of films, comprising at least two first ferromagnetic layers respectively having a first easy axis and a second easy axis, a nano oxide layer located between the first ferromagnetic layers, and a first pinned ferromagnetic layer, wherein the first and second easy axes are about 90 degree twisted-coupled with the first easy axis parallel to the length of the first conductive line and the second easy axis perpendicular to the length of the first conductive line; and
   a storage device adjacent to the first conductive line, receiving a magnetic field generated from a current flowing through the first conductive line.

2. The memory cell structure as claimed in claim 1, wherein the first conductive line is cladded by the first ferromagnetic layer having the first easy axis parallel to the length of the first conductive line, the ferromagnetic layer with the first easy axis is cladded by the nano oxide layer, and the nano oxide layer is cladded by the ferromagnetic cladding layer having the second easy axis perpendicular to the length of the first conductive line.

3. The memory cell structure as claimed in claim 1, further comprising:
   a second conductive line cladded by a second ferromagnetic layer having a third easy axis parallel to the length of the second conductive line; and
   a second pinned ferromagnetic layer cladding the second ferromagnetic layer.

4. The memory cell structure as claimed in claim 3, wherein the second conductive line is substantially perpendicular to the first conductive line.

5. The memory cell structure as claimed in claim 3, wherein the magnetic direction of the first pinned ferromagnetic layer and the second pinned ferromagnetic layer are the same.

6. The memory cell structure as claimed in claim 1, wherein the storage device is a magnetoresistive tunneling junction(MTJ) memory cell.

7. The memory cell structure as claimed in claim 3, further comprising a switch coupled between the storage device and one of the first conductive line and the second conductive line.

8. The memory cell structure as claimed in claim 3, wherein the second easy axis is substantially parallel to the third easy axis.

9. The memory cell structure as claimed in claim 1, wherein the first ferromagnetic layers, the nano oxide layer, and the first pinned ferromagnetic layer partially surrounds the first conductive line and exposes the first conductive line toward the storage device.

10. The memory cell structure as claimed in claim 3, wherein the second ferromagnetic layer and the second pinned ferromagnetic layer partially surrounds the second conductive line and exposes the second conductive line toward the storage device.

11. A memory cell structure, comprising:
 a first conductive line cladded by a plurality of films, the films comprising:
  a first ferromagnetic layer having a first easy axis and cladding the first conductive line, wherein the first easy axis is parallel to the length of the first conductive line;
  a nano oxide layer cladding the first ferromagnetic layer;
  a synthetic anti-ferromagnetic layer cladding the nano oxide layer, comprising:
   a second ferromagnetic layer having a second easy axis perpendicular to the first easy axis;
   a third ferromagnetic layer having a third easy axis anti-parallel to the second easy axis; and
   a non-magnetic layer located between the second ferromagnetic layer and the third ferromagnetic layer; and
  a first pinned ferromagnetic layer cladding the synthetic anti-ferromagnetic layer; and
 a storage device adjacent to the first conductive line, receiving a magnetic field generated from a current flowing through the first conductive line.

12. The memory cell structure as claimed in claim 11, further comprising:
 a second conductive line, comprising:
  a fourth ferromagnetic layer having a fourth easy axis parallel to the length of the second conductive line; and
  a second pinned ferromagnetic layer cladding the second ferromagnetic layer.

13. The memory cell structure as claimed in claim 12, wherein the second conductive line is substantially perpendicular to the first conductive line.

14. The memory cell structure as claimed in claim 12, wherein the magnetic direction of the first pinned ferromagnetic layer and the second pinned ferromagnetic layer are the same.

15. The memory cell structure as claimed in claim 11, wherein the storage device is a magnetoresistive tunneling junction (MTJ) memory cell.

16. The memory cell structure as claimed in claim 12, further comprising a switch coupled between the storage device and one of the first conductive line and the second conductive line.

17. The memory cell structure as claimed in claim 12, wherein the first easy axis is substantially parallel to the fourth easy axis.

18. The memory cell structure as claimed in claim 11, wherein the first ferromagnetic layer, the nano oxide layer, the synthetic anti-ferromagnetic layer, and the first pinned ferromagnetic layer partially surrounds the first conductive line and exposes the first conductive line toward the storage device.

19. The memory cell structure as claimed in claim 12, wherein the second ferromagnetic layer and the second pinned ferromagnetic layer partially surrounds the second conductive line and exposes the second conductive line toward the storage device.

20. A memory cell structure, comprising:
 a first conductive line cladded by a plurality of films, comprising at least two first ferromagnetic layers respectively having a first easy axis and a second easy axis, a nano oxide layer located between the first ferromagnetic layers, and a first pinned ferromagnetic layer, wherein the first and second easy axes are about 90 degree twisted-coupled with the first easy axis parallel to the length of the first conductive line and the second easy axis perpendicular to the length of the first conductive line;
 a second conductive line substantially perpendicular to the first conductive line, cladded by a second ferromagnetic layer having a third easy axis parallel to the length of the second conductive line;
 a second pinned ferromagnetic layer cladding the second ferromagnetic layer; and
 a storage device adjacent to the first conductive line, receiving a magnetic field generated from a current flowing through the first conductive line.

* * * * *